United States Patent
Lin et al.

[11] Patent Number: 6,133,083
[45] Date of Patent: Oct. 17, 2000

[54] METHOD TO FABRICATE EMBEDDED DRAM

[75] Inventors: Tony Lin, Kaohsiung Hsien; Coming Chen, Taoyuan Hsien; Jenn Tsao, Taipei, all of Taiwan

[73] Assignee: United Microelectronics Corp., Hsinchu, Taiwan

[21] Appl. No.: 09/218,543

[22] Filed: Dec. 22, 1998

[51] Int. Cl.[7] .................. H01L 21/8234; H01L 21/8244
[52] U.S. Cl. ........................... 438/238; 438/241
[58] Field of Search .................... 438/238, 239, 438/241, 199, 197

[56] References Cited

U.S. PATENT DOCUMENTS

| | | | |
|---|---|---|---|
| 4,985,718 | 1/1991 | Ishijima | 357/23.6 |
| 5,661,063 | 8/1997 | Lee | 437/32 |

*Primary Examiner*—Richard Elms
*Assistant Examiner*—Bradley K Smith

*Attorney, Agent, or Firm*—Hickman Coleman & Hughes, LLP

[57] ABSTRACT

A method for fabricating an embedded DRAM. A substrate having a memory circuit region and a logic circuit region is provided. A first gate, a first source/drain region and a second source/drain region are formed in the memory circuit region. A second gate and a third source/drain region are formed in the logic circuit region. A first dielectric layer is formed over the substrate. In the first dielectric layer, a first contact hole is formed to expose the first source/drain region and a second contact hole is formed to expose the second gate and the third source/drain region. A bit line is formed to electrically couple with the first source/drain region through the first contact hole. A local interconnect is formed to electrically couple with the second gate and the third source/drain region through the second contact hole. A second dielectric layer is formed over the substrate. A third contact hole is formed in the first dielectric layer and the second dielectric layer to expose the second source/drain region. A capacitor is formed to electrically couple with the second source/drain region through the third contact hole.

9 Claims, 4 Drawing Sheets

METHOD TO FABRICATE EMBEDDED DRAM

BACKGROUND OF THE INVENTION

1. Field of the Invention

The present invention relates to a method of fabricating an embedded DRAM. More particularly, the present invention relates to a method for fabricating an embedded DRAM which integrates a local interconnect process.

2. Description of the Related Art

An embedded DRAM is a device that integrates a memory circuit and a logic circuit into single chip. This design scheme allows the device to have very fast access speed, making the DRAM device useful in data processing systems that require high speed, where large amounts of data are processed.

FIGS. 1A through 1D are schematic, cross-sectional diagrams used to depict steps in a conventional method for fabricating an embedded DRAM.

Referring to FIG. 1A, a memory circuit region 101 and a logic circuit region 119 are formed in a substrate 100, wherein the memory circuit region 101 and the logic circuit region 119 are separated by an isolation region 108. Gates 102, 104 and source/drain regions 110, 112, 114 are formed in the memory circuit region 101, wherein the gates 102 and 104 are neighbors. A gate 106 and source/drain regions 116, 118 are formed in the logic circuit region 119.

Referring to FIG. 1B, a dielectric layer 120 is formed over the substrate 100. A contact hole 122 is formed in the dielectric layer 120 to expose the source/drain region 112. A bit line 124 is formed to electrically couple with the source/drain region 112 through the contact hole 122.

Referring to FIG. 1 C, a dielectric layer 126 is formed over the substrate 100. A contact hole 128 is formed in the dielectric layers 120 and 126 to expose the source/drain region 110. A capacitor 130 is formed to electrically couple with the source/drain region 110 through the contact hole 128. The capacitor 130 includes a bottom electrode 132, a dielectric layer 134 and an upper electrode 136. A dielectric layer 138 is formed over the substrate 100.

Referring to FIG. 1D, contact holes 140, 142 are formed in the dielectric layers 120, 126 and 138 to expose the source/drain region 116 and the gate 106, respectively. An interconnect 144 is formed to electrically couple with the source/drain region 116 and the gate 106 through the contact holes 140 and 142.

The interconnect 144 is formed after forming the capacitor 130. Because plural dielectric layers are formed over the substrate 100, the aspect ratio of the contact holes 140, 142 is high. It is difficult to form the contact holes 140, 142, and thus the interconnect 144 is also difficult to form. Furthermore, the conducting path of the interconnect 144 is too long to decrease the performance of the device.

Through the duration of forming the bit line 124 and the capacitor 130 in the memory circuit region 101, no device is formed in the logic circuit region 119. Thus, the elevation difference of the memory circuit 101 and the logic circuit region 119 is obvious. The subsequent photolithography process is affected.

SUMMARY OF THE INVENTION

It is therefore an objective of the present invention to provide a method for fabricating an embedded DRAM which simplifies the process and improve the performance of devices.

It is therefore another objective of the present invention to provide a method for fabricating an embedded DRAM which decreases the elevation difference between the memory circuit region and the logic circuit region.

To achieve these and other advantages and in accordance with the purpose of the invention, as embodied and broadly described herein, the invention provides a method of fabricating an embedded DRAM. The method for fabricating this embedded DRAM includes the following steps. A substrate having a memory circuit region and a logic circuit region is provided. A first gate, a first source/drain region and a second source/drain region are formed in the memory circuit region. A second gate and a third source/drain region are formed in the logic circuit region. A first dielectric layer is formed over the substrate. In the first dielectric layer, a first contact hole is formed to expose the first source/drain region and a second contact hole is formed to expose the second gate and the third source/drain region. A bit line is formed to electrically couple with the first source/drain region through the first contact hole. A local interconnect is formed to electrically couple with the second gate and the third source/drain region through the second contact hole. A second dielectric layer is formed over the substrate. A third contact hole is formed in the first dielectric layer and the second dielectric layer to expose the second source/drain region. A capacitor is formed to electrically couple with the second source/drain region through the third contact hole. is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
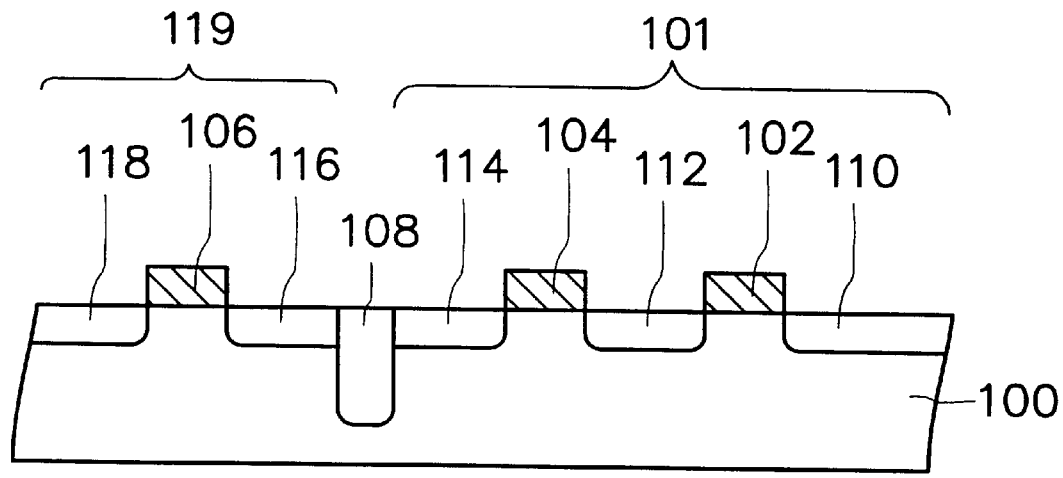
FIGS. 1A through 1D are schematic, cross-sectional diagrams used to depict steps in a conventional method for fabricating an embedded DRAM.
Figure 1B:
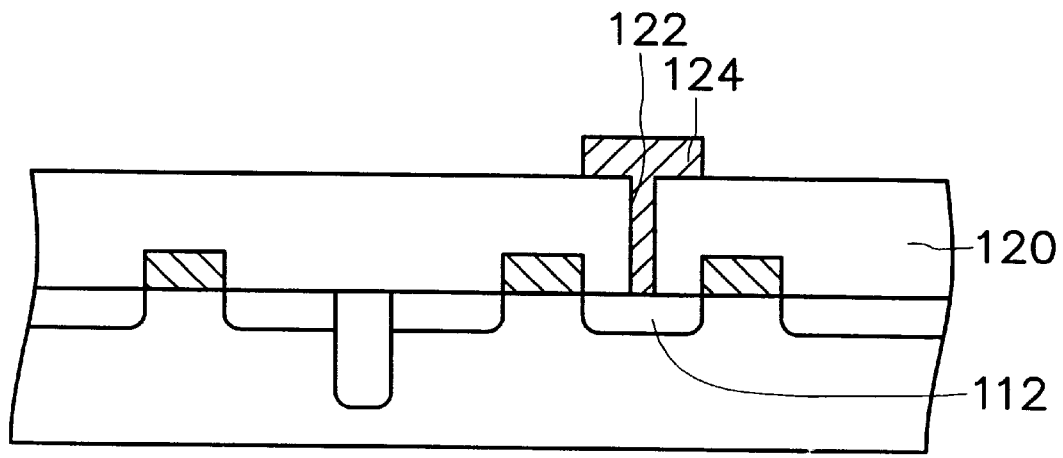
Figure 1C:
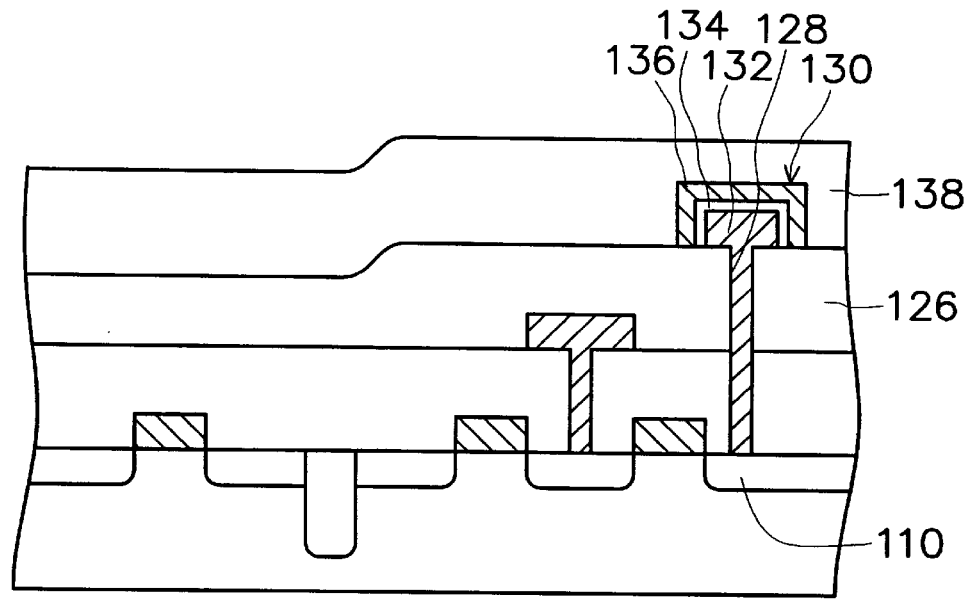
Figure 1D:
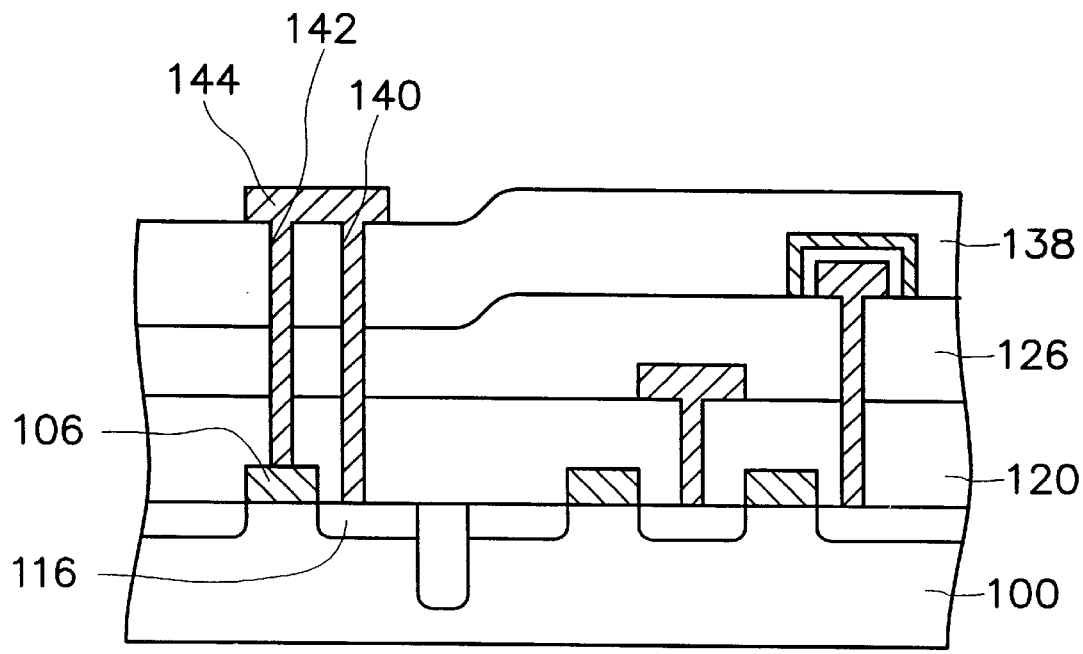

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional diagrams used to depict steps in a method according to the invention for fabricating an embedded DRAM.

Figure 2A:
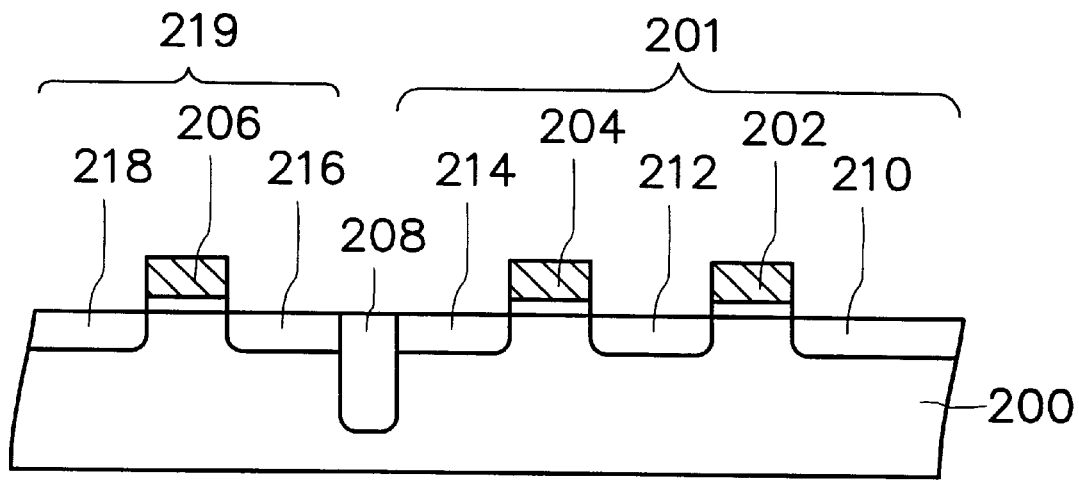
FIGS. 2A through 2C are schematic, cross-sectional diagrams used to depict steps in a method according to the invention for fabricating an embedded DRAM.

Referring to FIG. 2A, a memory circuit region 201 and a logic circuit region 219 are formed in a substrate 200, wherein the memory circuit region 201 and the logic circuit region 219 are separated by an isolation region 208. The isolation region 208 includes shallow trench isolation. Gates 202, 204 and source/drain regions 210, 212, 214 are formed in the memory circuit region 201, wherein the gate 202 and 204 are neighbors. A gate 206 and source/drain regions 216, 218 are formed in the logic circuit region 219.

In order to decrease the resistivity of the gate, the gate is formed by polycide. Alternatively, the gate is formed by polysilicon and then a self-aligned silicide process is performed to form suicides on the polysilicon layer and the source/drain region at the same step. However, silicides can lead to a shallow junction in the source/drain region, which result in the generation of a large leakage current at the junction between a capacitor and the source/drain region.

In view of this, the gates 202 and 204 are formed by polycide and silicides are not formed on the source/drain regions 210, 212 and 214. Silicides are formed on the gate 206 and the source/drain regions 216 and 218.

Figure 2B:
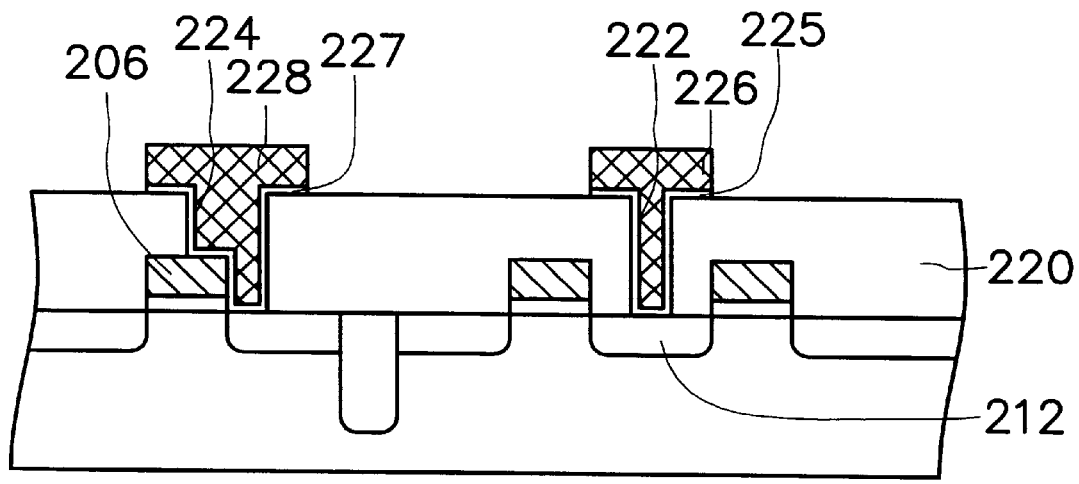

Referring to FIG. 2B, a dielectric layer 220 is formed over the substrate 200. Contact holes 222, 224 are formed in the dielectric layer 220. The contact hole 222 exposes the source/drain region 212 and the contact hole 224 exposes the gate 206 and the source/drain region 216. A bit line 226 is formed to electrically couple with the source/drain region 212 through the contact hole 222; furthermore, a conformal barrier layer 225 is formed between the bit line 226 and the dielectric layer 220. A local interconnect 228 is formed to electrically couple with the gate 206 and the source/drain region 216 through the contact hole 224, and a conformal barrier layer 227 is formed between the bit line 228 and the dielectric layer 220.

The bit line 226 and the local interconnect 228 include polysilicon or metal such as tungsten or copper. The material used to form the conformal barrier layers 225 and 227 is selected from a group consisting of titanium, titanium nitride, tungsten nitride, tungsten-silicon-nitride, tantalum and tantalum nitride.

Figure 2C:
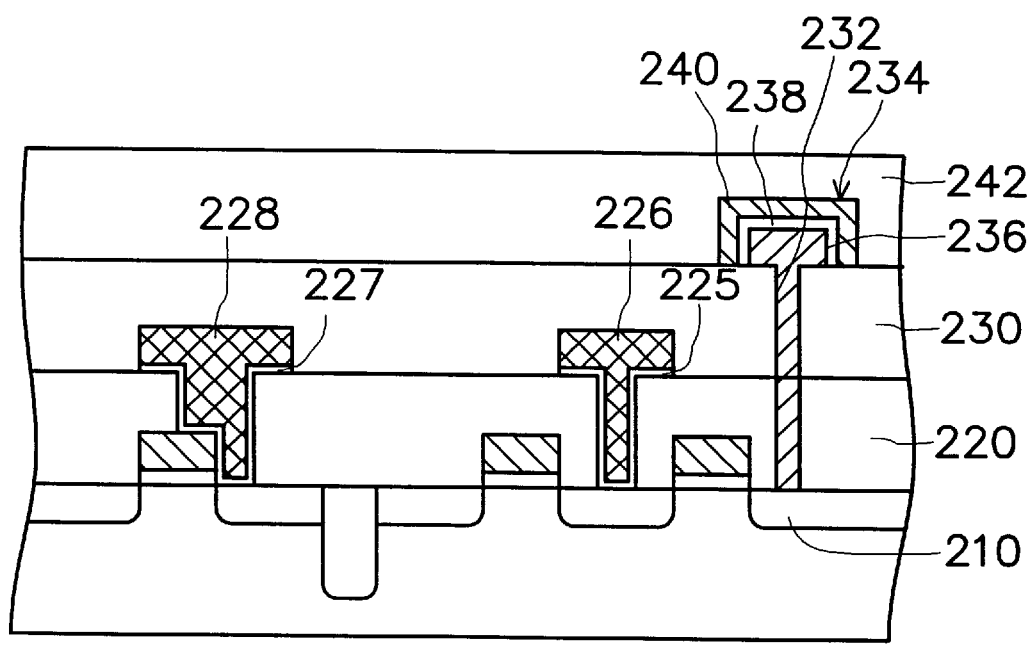

Referring to FIG. 2C, a dielectric layer 230 is formed over the substrate 200. A contact hole 232 is formed in the dielectric layer 220 and 230 to expose the source/drain region 210. A capacitor 234 is formed to electrically couple with the source/drain region 210 through the contact hole 232. The capacitor 234 includes a bottom electrode 236, a dielectric layer 238 and an upper electrode 240.

According to the foregoing, the advantages of the invention include the following:

1. The bit line and the local interconnect are formed simultaneously, thus the process is simplified.

2. The conducting path of the local interconnect is reduced, thus the performance of the device is improved.

3. The elevation difference of the memory circuit region and the logic circuit region is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating an embedded DRAM, comprising the steps of:

providing a substrate having a memory circuit region and a logic circuit region;

forming a first gate, a first source/drain region and a second source/drain region in the memory circuit region;

forming a second gate and a third source/drain region in the logic circuit region;

forming a first dielectric layer over the substrate;

forming a first contact hole in the first dielectric layer to expose the first source/drain region and a second contact hole in the first dielectric layer to expose the second gate and the third source/drain region;

forming a bit line to electrically couple with the first source/drain region through the first contact hole;

forming a local interconnect to electrically couple with the second gate and the third source/drain region through the second contact hole;

forming a second dielectric layer over the substrate;

forming a third contact hole in the first dielectric layer and the second dielectric layer to expose the second source/drain region; and forming a capacitor to electrically couple with the second source/drain region through the third contact hole.

2. The method of claim 1, wherein the first gate is formed by polycide.

3. The method of claim 1, wherein suicides are formed on the second gate and the third source/drain region before forming the first dielectric layer.

4. The method of claim 1, wherein the bit line and the local interconnect include polysilicon.

5. The method of claim 1, wherein the bit line and the local interconnect include metal.

6. The method of claim 1, wherein conformal barrier layers are formed in the first and second contact hole before forming the bit line and the local interconnect.

7. The method of claim 6, wherein the material used to form the conformal barrier layer is selected from a group consisting of titanium, titanium nitride, tungsten nitride, tungsten-silicon-nitride, tantalum and tantalum nitride.

8. The method of claim 5, wherein the bit line and the local interconnect include tungsten.

9. The method of claim 5, wherein the bit line and the local interconnect include copper.

* * * * *